US012696764B2

(12) United States Patent
Kusukawa et al.

(10) Patent No.: US 12,696,764 B2
(45) Date of Patent: Jul. 28, 2026

(54) POWER SEMICONDUCTOR DEVICE WITH COOLER HEREIN

(71) Applicant: Hitachi Astemo, Ltd., Hitachinaka (JP)

(72) Inventors: Junpei Kusukawa, Tokyo (JP); Eiichi Ide, Tokyo (JP); Takashi Hirao, Hitachinaka (JP); Yujiro Kaneko, Hitachinaka (JP)

(73) Assignee: Hitachi Astemo, Ltd., Ibaraki (JP)

( * ) Notice: Subject to any disclaimer, the term of this patent is extended or adjusted under 35 U.S.C. 154(b) by 388 days.

(21) Appl. No.: 18/570,145

(22) PCT Filed: Mar. 2, 2022

(86) PCT No.: PCT/JP2022/008993
§ 371 (c)(1),
(2) Date: Dec. 14, 2023

(87) PCT Pub. No.: WO2023/276278
PCT Pub. Date: Jan. 5, 2023

(65) Prior Publication Data
US 2024/0282665 A1 Aug. 22, 2024

(30) Foreign Application Priority Data
Jul. 1, 2021 (JP) ................................. 2021-110185

(51) Int. Cl.
*H10W 40/70* (2026.01)
*H10W 70/68* (2026.01)
*H10W 74/10* (2026.01)

(52) U.S. Cl.
CPC ....... *H10W 40/70* (2026.01); *H10W 70/6875* (2026.01); *H10W 74/111* (2026.01)

(58) Field of Classification Search
None
See application file for complete search history.

(56) References Cited

U.S. PATENT DOCUMENTS

| | | | | |
|---|---|---|---|---|
| 5,629,562 A | * | 5/1997 | Nomura | ................ H10W 40/60 257/E23.083 |
| 6,542,365 B2 | * | 4/2003 | Inoue | .................... H10W 40/47 361/689 |

(Continued)

FOREIGN PATENT DOCUMENTS

| | | | | |
|---|---|---|---|---|
| DE | 102015213495 B4 | * | 6/2025 | ............ H10W 78/00 |
| JP | 2012-015224 A | | 1/2012 | |

(Continued)

OTHER PUBLICATIONS

Original and Translation of JP2013149730 (Year: 2013).*

(Continued)

*Primary Examiner* — Timothy J. Dole
*Assistant Examiner* — Muhammed Azam
(74) *Attorney, Agent, or Firm* — Volpe Koenig

(57) ABSTRACT

A power semiconductor device includes a circuit body in which a conductor plate and a semiconductor element mounted on the conductor plate are sealed with a sealing resin, a cooler disposed opposite to at least one surface of the circuit body, and an insulating member disposed between the circuit body and the cooler. The insulating member includes an insulating sheet bonded to the cooler and a conductor layer bonded to a surface of the insulating sheet facing the circuit body. Electrically insulating heat-dissipation grease is filled between the circuit body and the cooler and covers the insulating sheet and the conductor layer. In some embodiments, an outer peripheral edge of the conductor layer is positioned outward of an outer peripheral edge of a surface of the conductor plate exposed from the sealing resin. In some embodiments, the conductor layer is embedded in the insulating sheet or an end part of the conductor layer is covered with an insulating resin having lower elasticity than the sealing resin.

6 Claims, 6 Drawing Sheets

(56)            References Cited

U.S. PATENT DOCUMENTS

| | | | | |
|---|---|---|---|---|
| 7,245,493 | B2 * | 7/2007 | Inagaki | H10W 40/47 |
| | | | | 174/15.1 |
| 7,671,465 | B2 * | 3/2010 | Funakoshi | H10W 40/778 |
| | | | | 257/706 |
| 8,008,772 | B2 * | 8/2011 | Morita | H10W 72/30 |
| | | | | 257/737 |
| 8,198,539 | B2 * | 6/2012 | Otoshi | H05K 3/0061 |
| | | | | 361/698 |
| 8,450,845 | B2 * | 5/2013 | Ikeda | H10W 40/255 |
| | | | | 257/E23.101 |
| 8,659,147 | B2 * | 2/2014 | Mitsui | H10W 74/111 |
| | | | | 257/713 |
| 9,277,682 | B2 * | 3/2016 | Kaneko | H05K 7/209 |
| 10,177,084 | B2 * | 1/2019 | Tsuyuno | H10W 70/65 |
| 10,186,473 | B2 * | 1/2019 | Hojo | H10W 40/255 |
| 10,818,573 | B2 * | 10/2020 | Tsuyuno | H10W 40/22 |
| 11,195,803 | B2 * | 12/2021 | Yoshida | H10D 62/8325 |
| 11,201,143 | B2 * | 12/2021 | Tokuyama | H10W 40/255 |
| 11,232,994 | B2 * | 1/2022 | Tsuyuno | H10W 40/10 |
| 11,350,517 | B2 * | 5/2022 | Yahara | H05K 1/0203 |
| 11,430,716 | B2 * | 8/2022 | Kusukawa | H02M 1/32 |
| 11,848,295 | B2 * | 12/2023 | Otsuka | H10W 40/255 |
| 11,956,933 | B2 * | 4/2024 | Hirao | H02M 7/003 |
| 12,283,536 | B2 * | 4/2025 | Shimazu | H10W 40/60 |
| 12,506,046 | B2 * | 12/2025 | Tsuyuno | H10W 40/47 |
| 12,506,133 | B2 * | 12/2025 | Tsuyuno | H02M 7/003 |
| 2005/0030717 | A1 * | 2/2005 | Inagaki | H10W 40/47 |
| | | | | 257/E23.098 |
| 2006/0284308 | A1 * | 12/2006 | Harada | H02M 7/003 |
| | | | | 257/729 |
| 2007/0216013 | A1 * | 9/2007 | Funakoshi | H10W 40/778 |
| | | | | 257/691 |
| 2009/0116197 | A1 * | 5/2009 | Funakoshi | H10W 40/778 |
| | | | | 438/122 |
| 2009/0194862 | A1 * | 8/2009 | Kitami | H10W 40/778 |
| | | | | 257/706 |
| 2009/0224398 | A1 * | 9/2009 | Noritake | H10W 40/47 |
| | | | | 438/122 |
| 2013/0265724 | A1 | 10/2013 | Kaneko et al. | |
| 2013/0270684 | A1 * | 10/2013 | Negishi | H10W 70/461 |
| | | | | 174/257 |
| 2015/0035137 | A1 * | 2/2015 | Nishimoto | B23K 1/0016 |
| | | | | 228/245 |
| 2019/0067154 | A1 | 2/2019 | Yoshihara et al. | |
| 2023/0135773 | A1 * | 5/2023 | Hirao | H02M 7/003 |
| | | | | 363/13 |
| 2023/0282549 | A1 * | 9/2023 | Kong | H10W 40/40 |
| 2024/0014088 | A1 * | 1/2024 | Kusukawa | H10W 74/121 |
| 2024/0047231 | A1 * | 2/2024 | Tsuyuki | H10W 74/016 |
| 2024/0096727 | A1 * | 3/2024 | Shimazu | H10W 40/22 |
| 2024/0282665 | A1 * | 8/2024 | Kusukawa | H10W 40/255 |
| 2025/0105110 | A1 * | 3/2025 | Tsuyuno | H10W 70/458 |
| 2025/0391736 | A1 * | 12/2025 | Tang | H10W 40/778 |

FOREIGN PATENT DOCUMENTS

| | | | |
|---|---|---|---|
| JP | 2012-134222 A | | 7/2012 |
| JP | WO2016006054 A1 | * | 1/2016 |
| JP | 2016-111089 A | | 6/2016 |
| JP | 6116416 B2 | | 4/2017 |
| WO | 2017/175612 A1 | | 10/2017 |

OTHER PUBLICATIONS

Original and Translation of JP2016111089 (Year: 2016).*
Original and Translation of JP2024006810 (Year: 2024).*
Original and Translation of CN11943154 (Year: 2020).*
International Search Report dated May 17, 2022 for PCT International Application No. PCT/JP2022/008993.

* cited by examiner 13, 23     16, 26     14, 24     16, 26

POWER SEMICONDUCTOR DEVICE WITH COOLER HEREIN

TECHNICAL FIELD

The present invention relates to a power semiconductor device.

BACKGROUND ART

As a background art of the invention of the present application, PTL 1 below discloses a configuration in which an insulating sheet is bonded to a cooler and a conductor is bonded to the insulating sheet to secure a large insulation distance between two conductor plates of a power module.

CITATION LIST

Patent Literature

PTL 1: JP 6116416 B2

SUMMARY OF INVENTION

Technical Problem

Unfortunately, a technique of PTL 1 causes a problem that when a current flowing through a semiconductor element increases, the current causes stress between the cooler and the insulating sheet, between the insulating sheet and the conductor plate, between the insulating sheet and a bonding material, or between the bonding material and the conductor plate on which the semiconductor element is mounted, the stress causing peeling or cracking at each interface. Thus, an object of the present invention is to provide a power semiconductor device of achieving miniaturization, high density, maintenance of insulation, and reliability in a compatible manner.

Solution to Problem

A power semiconductor device according to the present invention includes: a circuit body in which a conductor plate and a semiconductor element mounted on the conductor plate are sealed with a sealing resin; a cooler disposed opposite to at least one surface of the circuit body; and an insulating member disposed between the circuit body and the cooler, the insulating member including: an insulating sheet bonded to the cooler; a conductor layer bonded to a surface of the insulating sheet, the surface facing the circuit body; and electrically insulating heat dissipation grease filled between the circuit body and the cooler, and formed covering the insulating sheet and the conductor layer.

Advantageous Effects of Invention

The power semiconductor device can be provided in which miniaturization, high density, maintenance of insulation, and reliability are achieved in a compatible manner.

Hereinafter, embodiments of the present invention will be described with reference to the drawings. The description and drawings below are examples for describing the present invention, and are eliminated and simplified as appropriate for the sake of clarity of description. The present invention can be also implemented in various other forms. Unless otherwise specified, each component may be singular or plural.

Each drawing shows a position, a size, a shape, a range, and the like of each component that may not represent an actual position, size, shape, range, and the like to facilitate understanding of the invention. Thus, the present invention is not necessarily limited to the position, size, shape, range, and the like disclosed in each drawing.

Description of Conventional Technique and Problem

Figure 1:
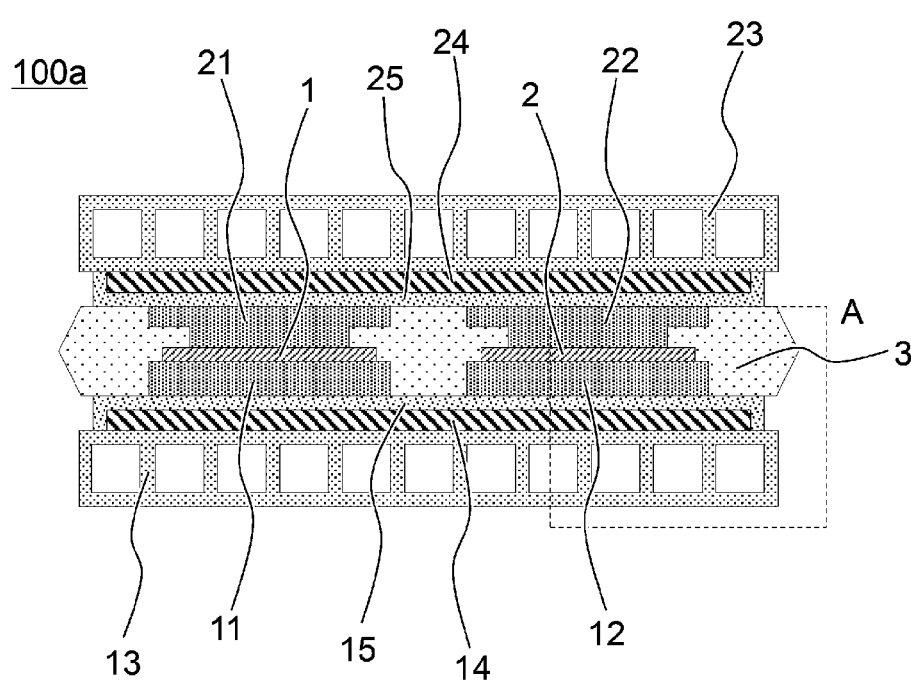
FIG. 1 is a sectional view of a power semiconductor device using a conventional technique.
Figure 2:
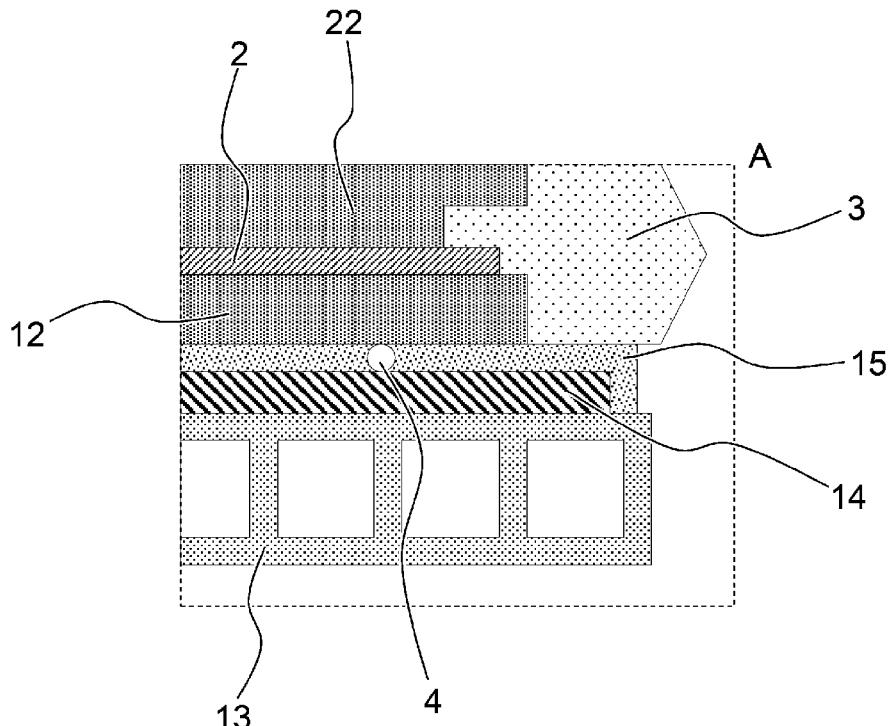
FIG. 2 is an enlarged view of a part A in FIG. 1.

FIG. 1 is a sectional view of a power semiconductor device using a conventional technique. FIG. 2 is an enlarged view of a part A in FIG. 1. Then, a power semiconductor device 100 will be described together with a power semiconductor device 100a with a configuration of the conventional technique.

A configuration of the power semiconductor device will be described. The power semiconductor device 100a includes: a circuit body including semiconductor elements 1 and 2, and conductor plates 11, 12, 21, and 22; and coolers 13 and 23. The power semiconductor device 100a includes insulating sheets 14 and 24 that respectively bonded to surfaces of the coolers 13 and 23 as insulating members. Additionally, electrically insulating greases 15 and 25 are respectively provided as insulating members between the insulating sheet (highly thermally conductive resin insulating sheet) 14 and the circuit body including the conductor plates 11 and 12, and between the insulating sheet 24 and the circuit body. The electrically insulating greases 15 and 25 are filled between the circuit body and the coolers 13 and 23, and are formed covering the insulating sheets 14 and 24, respectively.

The coolers 13 and 23 dissipate heat generated by the semiconductor elements 1 and 2 provided in the circuit body. To prevent air from being caught between the coolers 13 and 23, and the corresponding insulating sheets 14 and 24, the coolers 13 and 23, and the corresponding insulating sheets 14 and 24, are bonded to each other using a vacuum press. The semiconductor elements 1 and 2 are respectively mounted on the conductor plates 11 and 12, and the conductor plates 11 and 12, and are sealed (transfer molded) with a sealing resin 3 to function as a circuit body. The insulating sheets 14 and 24 each have a surface facing the circuit body, the surface and the circuit body being not fixed by the corresponding one of the insulating sheets 14 and 24 or a bonding member, so that peeling and cracking are prevented from occurring between the insulating sheets 14 and 24, and parts of the circuit body, the parts facing the corresponding conductor plates 11 and 12, and between the insulating sheets 14 and 24, and corresponding bonding materials.

Copper plates are used as a first conductor plate 11 and a second conductor plate 12, and a power semiconductor element (IGBT) 1 is bonded to one surface of the first conductor plate 11 and a power semiconductor element (diode) 2 is bonded to one surface of the second conductor plate 12 using a bonding member (not illustrated) such as solder. The coolers 13 and 23 are not necessarily configured to sandwich the circuit body from its both surfaces, and the coolers 13 and 23 may be installed to cool only one of the surfaces of the circuit body.

Then, the IGBT 1 includes a gate terminal that is electrically connected to a control terminal conductor by a wire (not illustrated), and a third conductor plate 21 and a fourth conductor 22 are also bonded to respective opposite surfaces of the power semiconductor elements 1 and 2 using a bonding member. The power semiconductors and the conductor plates are insulated and sealed with the sealing resin 3 by transfer molding to expose surfaces of the conductor plates, the surfaces being opposite to surfaces bonded to the power semiconductor elements, and thus the circuit body is completed. The coolers 13 and 23 are each formed using a cooler made of aluminum and provided inside with a water passage.

When the surfaces of the conductor plates, the surfaces being opposite to the surfaces bonded to the power semiconductor elements, are covered with the sealing resin, the sealing resin may be removed by grinding. The surfaces of the conductor plates, the surfaces being opposite to surfaces bonded to the power semiconductor elements, are exposed to enhance heat dissipation.

Unfortunately, when a void 4 (an air bubble) as trapped air is present in the electrically insulating greases 15 and 25 between the insulating sheets 14 and 24, and the conductor plates 11 and 12 of the circuit body in a device having a conventional structure as illustrated in FIG. 2, an electric field due to a voltage applied between the conductor plates 11 and 12, and the coolers 13 and 23 is concentrated on the void 4 or trapped air, having a small relative permittivity, and thus when a high voltage is applied, partial discharge may occur in the void 4 or the trapped air.

When the semiconductor device 100a is continuously used while the partial discharge continuously occurs, the insulating sheets 14 and 24 may be broken by dielectric breakdown. Although the partial discharge can be reduced by increasing thickness of the insulating sheets 14 and 24, thermal resistance increases to fail to dissipate heat generated in the semiconductor elements 1 and 2. That is, to achieve both the insulation against voltage and the heat dissipation in the semiconductor device, peeling needs to be prevented from occurring in each interface when a current flowing through the semiconductor element is increased to increase a temperature rise. The peeling is caused due to a temperature cycle in which heat generation and cooling are repeated to cause stress between the coolers 13 and 23, and the corresponding insulating sheets 14 and 24 made of resin, and between the insulating sheets 14 and 24 made of resin, and the corresponding conductor plates 11 and 12, due to a difference in a thermal expansion coefficient of each of materials of the coolers 13 and 23, the insulating sheets 14 and 24 made of resin, and the conductor plates 11 and 12.

FIRST EMBODIMENT

Figure 3:
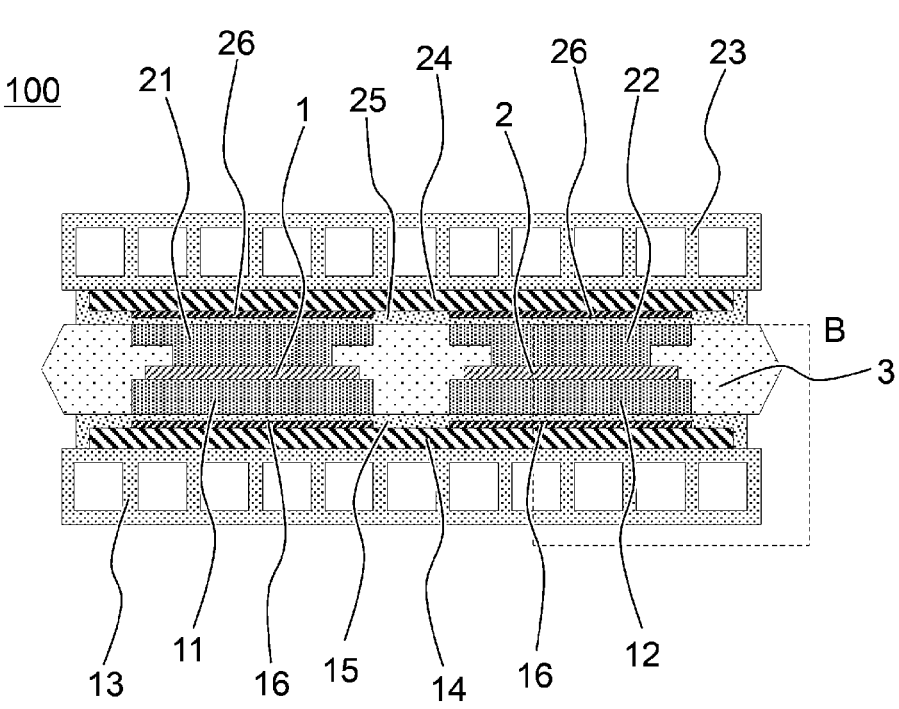
FIG. 3 is a diagram illustrating a sectional structure of a power semiconductor device according to a first embodiment of the present invention.
Figure 4:
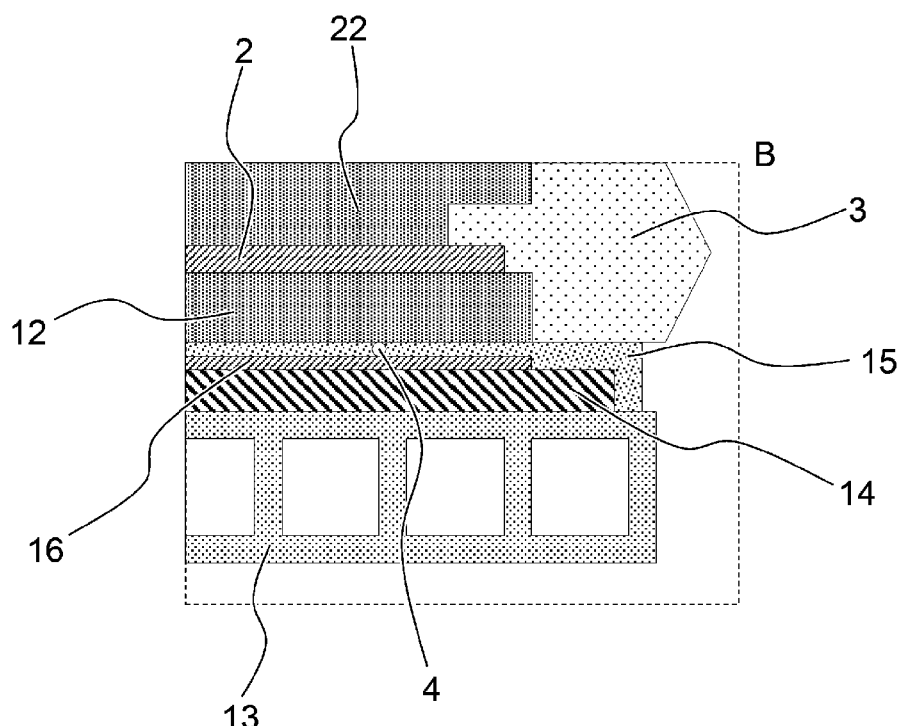
FIG. 4 is an enlarged view of a part B in FIG. 3.

FIG. 3 is a diagram illustrating a sectional structure of a power semiconductor device according to a first embodiment of the present invention, and FIG. 4 is an enlarged view of a part B of FIG. 3. Then, a configuration of the power semiconductor device viewed from a plane is described with reference to FIG. 10.

Figure 10:
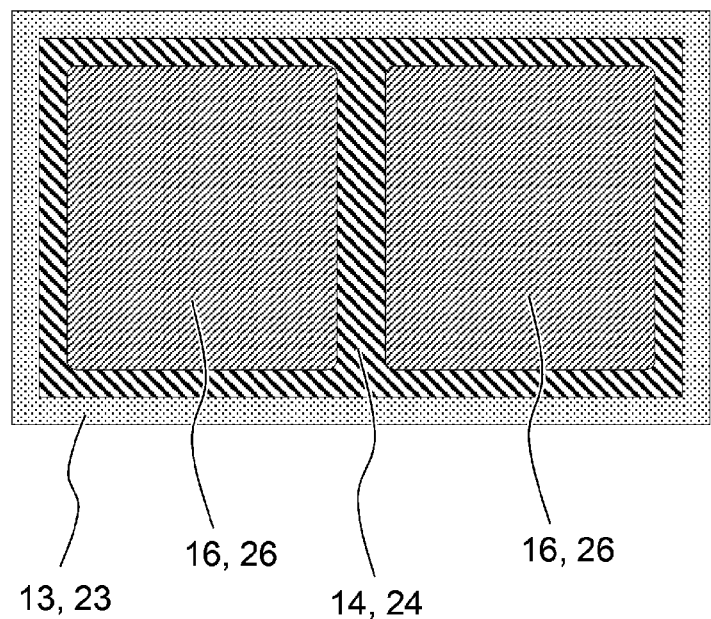
FIG. 10 is a plan view of a power semiconductor device of the present invention.

Embodiments of the present invention each have a basic structure as in the conventional technique. The embodiments are each different from the conventional technique in that conductor layers (conductor foil) 16 and 26 are formed on surfaces of the insulating sheets 14 and 24, respectively, the surfaces being opposite to surfaces bonded to the coolers 13 and 23. The conductor layers 16 and 26 are formed at positions facing the corresponding first to fourth conductor plates 11, 12, 21, and 22 of the circuit body, and are processed into shapes as illustrated in FIG. 10 by etching copper foil. The conductor plates of the circuit body and the conductor layers formed on the surfaces of the insulating sheets 14 and 24 in the present embodiment are each processed to have a substantially identical outer peripheral shape.

This configuration enables partial discharge to be prevented by the conductor layers 16 and 26 as described below even when the void 4 occurs as described above with reference to FIG. 2, so that deterioration and dielectric breakdown of the insulating sheets 14 and 24 can be suppressed, and insulation reliability of the device can be secured. As a result, high heat dissipation can be achieved by thinning the insulating sheets 14 and 24, and thus the configuration also can contribute to not only improvement of heat dissipation but also miniaturization and high density.

Principle of the Present Invention

Voltage applied between the conductor plates 11, 12, 21, and 22 of the circuit body, and the corresponding coolers 13 and 23, is divided by a capacity ratio between the insulating sheets 14 and 24, and the electrically insulating greases 15 and 25. The conductor layers 16 and 26 bonded to respective surfaces of the insulating sheets 14 and 24, the surfaces facing the circuit body, have potential equal to the divided voltage. Thus, the conductor layers 16 and 26 are fixed at the divided potential even when the void 4 or trapped air is present in heat dissipation greases 15 and 25, so that concentration of an electric field to the void 4 or the trapped air can be suppressed, and partial discharge can be prevented.

It is also conceivable that the heat dissipation greases 15 and 25 each have an extremely thin thickness that causes the conductor plates 11, 12, 21, and 22 of the circuit body and the corresponding conductor layers 16 and 26 formed on the surfaces of the insulating sheets 14 and 24 to come into contact with each other, and thus to be equal in electric potential. In this case, the insulating sheets 14 and 24 and the corresponding conductor layers 16 and 26 are in close contact with and bonded to each other. Thus, no void 4 is present to cause no space for generating a partial discharge, so that a partial discharge does not occur.

SECOND EMBODIMENT

Figure 5:
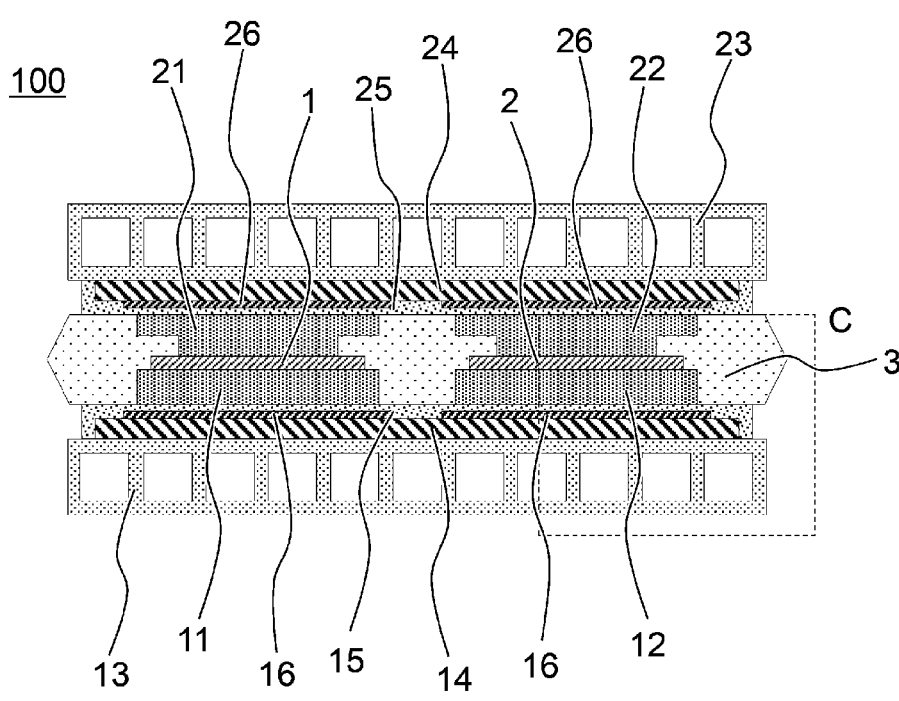
FIG. 5 is a diagram illustrating a sectional structure of a power semiconductor device according to a second embodiment of the present invention.
Figure 6:
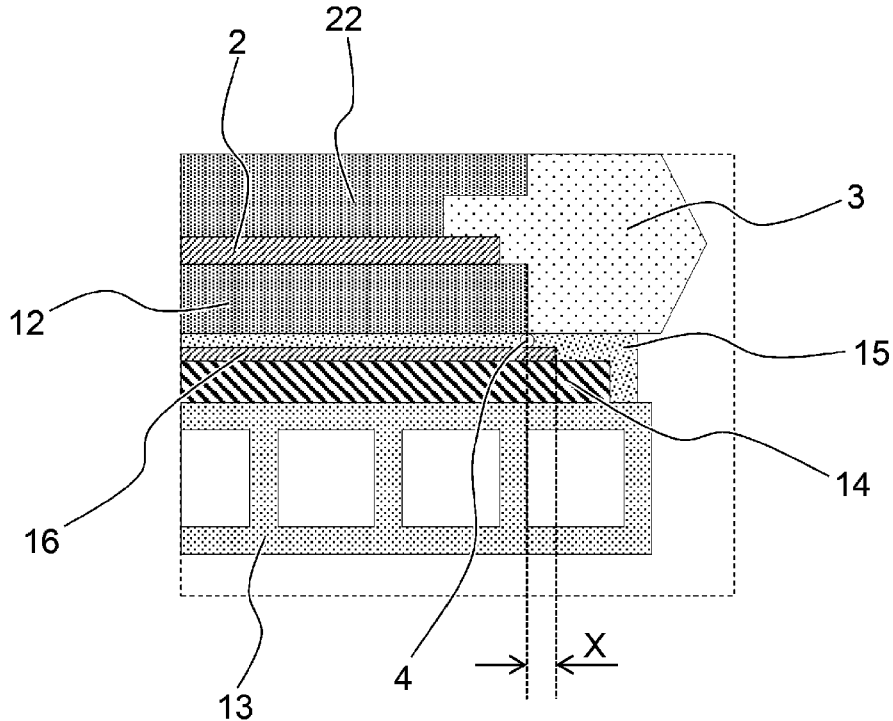
FIG. 6 is an enlarged view of a part C in FIG. 5.

FIG. 5 is a diagram illustrating a sectional structure of a power semiconductor device according to a second embodiment of the present invention. FIG. 6 is an enlarged view of a part C in FIG. 5.

The present embodiment is different from the first embodiment in that the conductor layers 16 and 26 formed on the surfaces of the insulating sheets 14 and 24, respectively, have outer peripheral edges that are each formed outward by a distance X from an outer peripheral edge of a surface (part exposed from the sealing resin 3) of each of the corresponding conductor plates 11, 12, 21, and 22 of the circuit body. This configuration enables preventing the above-described effect of the present invention from being reduced when the void 4 formed in the electrically insulating grease 15 or 25 is located on an outer periphery of the corresponding one of the conductor plates 11, 12, 21, and 22 of the circuit body (see FIG. 6) or when the coolers 13 and 23, and the circuit body, are displaced in position.

THIRD EMBODIMENT

Figure 7:
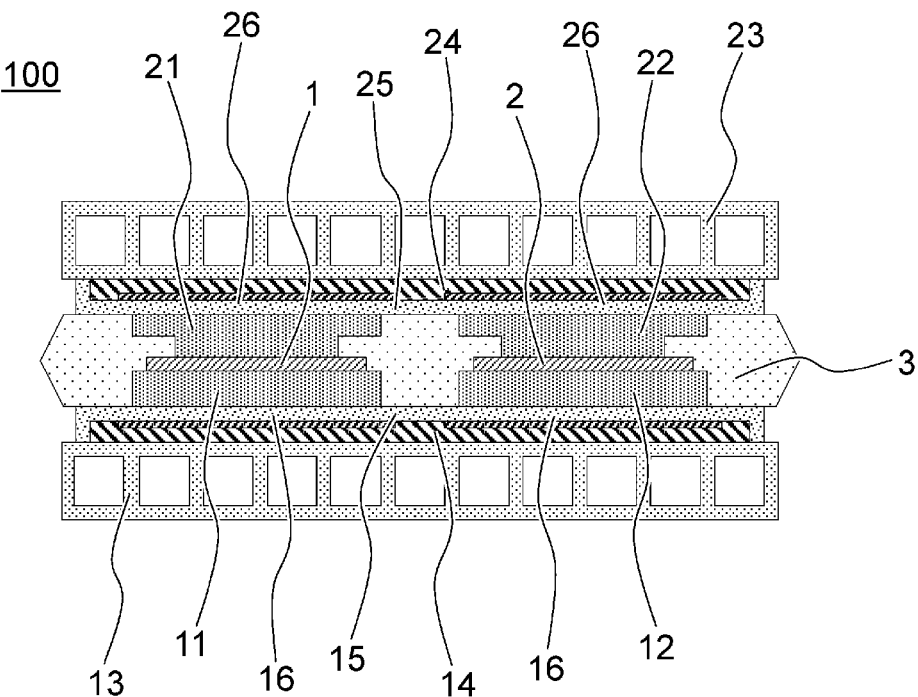
FIG. 7 is a diagram illustrating a sectional structure of a power semiconductor device according to a third embodiment of the present invention.

FIG. 7 is a diagram illustrating a sectional structure of a power semiconductor device according to a third embodiment of the present invention.

The present embodiment is different from the first and second embodiments in that conductor layers 16 and 26 are embedded in and bonded to insulating sheets 14 and 24, respectively. As in the second embodiment, the conductor layers 16 and 26 each have an outer peripheral edge formed outward by a distance X from an outer peripheral edge of a surface of each of corresponding conductor plates 11, 12, 21, and 22 of a circuit body. This configuration enables suppressing occurrence of partial discharge at end parts of the conductor layers 16 and 26 when a high voltage is applied.

FOURTH EMBODIMENT

Figure 8:
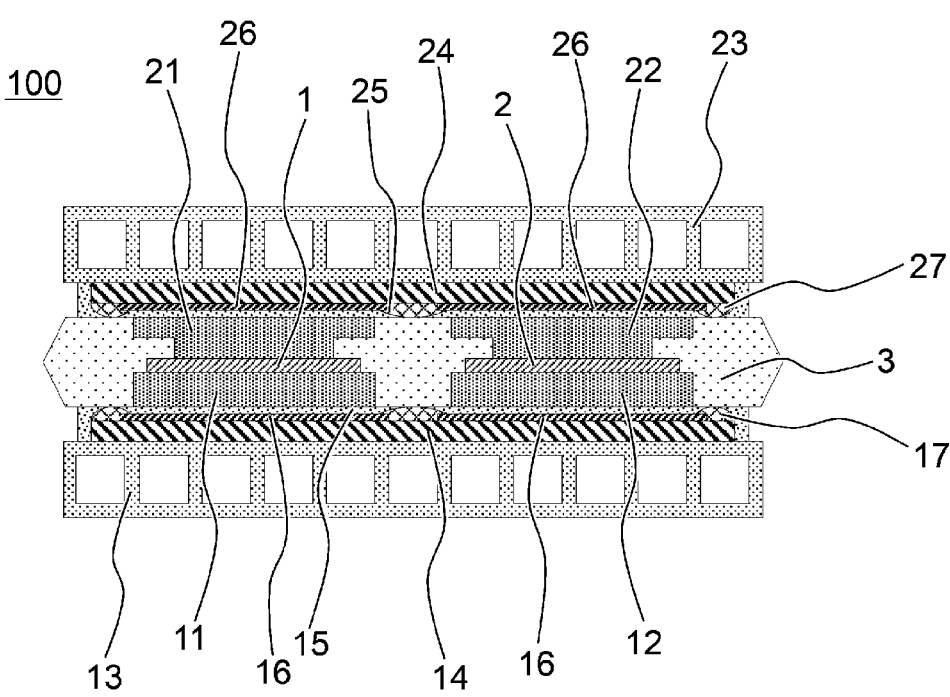
FIG. 8 is a diagram illustrating a sectional structure of a power semiconductor device according to a fourth embodiment of the present invention.

FIG. 8 is a diagram illustrating a sectional structure of a power semiconductor device according to a fourth embodiment of the present invention.

The present embodiment is different from the first to third embodiments in that conductor layers 16 and 26 bonded to surfaces of insulating sheets 14 and 24, respectively, the surfaces facing a circuit body, have respective end parts provided and covered with corresponding insulating resins 17 and 27 having lower elasticity than a sealing resin 3 of a circuit body. As in the second embodiment, the conductor layers 16 and 26 each have an outer peripheral edge formed outward by a distance X from an outer peripheral edge of a surface of each of corresponding conductor plates 11, 12, 21, and 22 of a circuit body.

Although the insulating resins 17 and 27 with low elasticity of the present embodiment are formed using a silicone adhesive, the insulating resins 17 and 27 with low elasticity are not particularly limited to silicone as long as having lower elasticity than the sealing resin 3. This configuration enables suppressing not only peeling of the conductor layers 16 and 26 from the insulating sheets 14 and 24, respectively, but also pumping out of electrically insulating heat dissipation greases 15 and 25.

FIFTH EMBODIMENT

Figure 9:
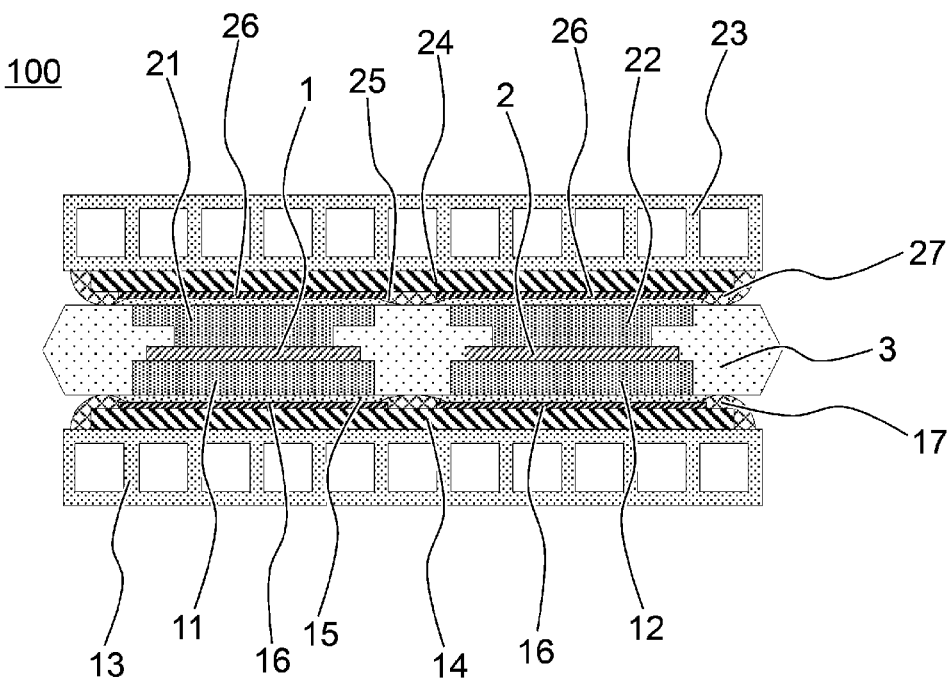
FIG. 9 is a diagram illustrating a sectional structure of a power semiconductor device according to a fifth embodiment of the present invention.

FIG. 9 is a diagram illustrating a sectional structure of a power semiconductor device according to a fifth embodiment of the present invention.

The present embodiment is different from the first to fourth embodiments in that conductor layers 16 and 26 bonded to surfaces of insulating sheets 14 and 24, respectively, the surfaces facing a circuit body, have respective first end parts, and the insulating sheets 14 and 24 bonded to surfaces of coolers 13 and 23, respectively, have respective second end parts, both the first and second end parts being respectively covered with insulating resins 17 and 27 having lower elasticity than a sealing resin 3 of the circuit body. As in the second embodiment, the conductor layers 16 and 26 each have an outer peripheral edge formed outward by a distance X from an outer peripheral edge of a surface of each of corresponding conductor plates 11, 12, 21, and 22 of a circuit body. This configuration enables suppressing not only peeling of the conductor layers 16 and 26 from the insulating sheets 14 and 24, respectively, and of the insulating sheets 14 and 24 from the coolers 13 and 23, respectively, but also pumping out of electrically insulating heat dissipation greases 15 and 25.

Figure 11:
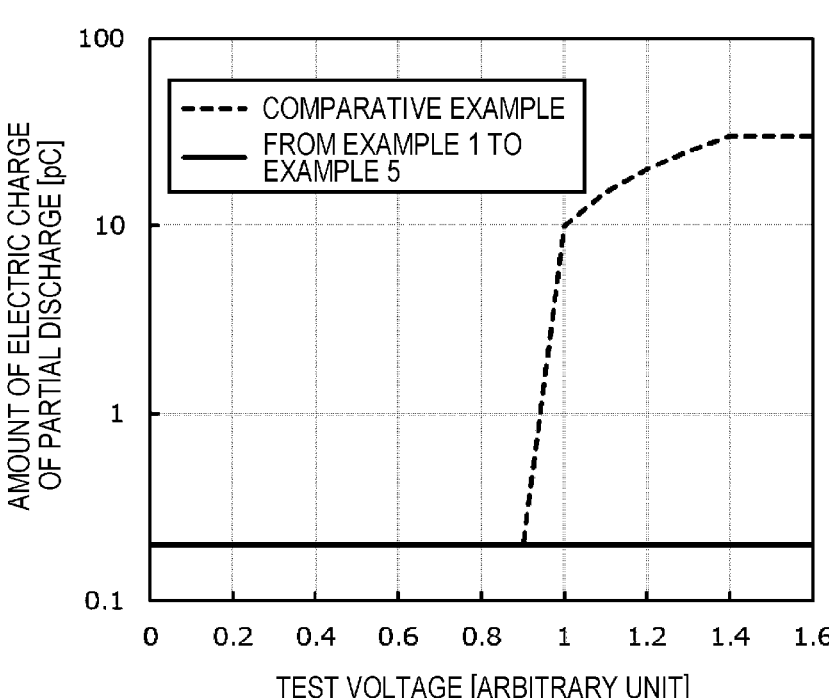
FIG. 11 is a diagram illustrating a result of a partial discharge test, the result showing a comparison between the conventional technique and the present invention.

FIG. 11 is a diagram illustrating a result of a partial discharge test, the result showing a comparison between the conventional technique and the present invention.

FIG. 11 has a horizontal axis representing test voltage, and a vertical axis representing the amount of discharged electric charge of partial discharge. This partial discharge test was performed using a partial discharge measuring device, in which all input/output terminals electrically connected to conductor plates of a circuit body were short-circuited to cause all the conductor plates to be equal in potential, an AC voltage was applied from 0 V between each of the terminals and a cooler by gradually increasing the voltage, and a voltage (partial discharge starting voltage) at which partial discharge occurred was measured. FIG. 11 shows Comparative Example that is a conventional configuration example, and Examples 1 to 5 that are respectively the first to fifth embodiments described above.

The test results reveal that partial discharge started to occur at a voltage at which the test voltage was 1 (arbitrary unit). This is considered to be due to occurrence of partial discharge in a void in the electrically insulating grease. In contrast, graphs of Examples 1 to 5 show that no partial discharge occurred in any power semiconductor device even when the test voltage was 1.6 exceeding 1 (arbitrary unit). That is, it is found that using the embodiments of the present invention enables reducing concentration of an electric field to even a part where a void or trapped air is present in the electrically insulating grease, and as a result, partial discharge voltage can be improved.

According to one embodiment of the present invention described above, operational effects below are achieved.

(1) The power semiconductor device 100 includes the circuit body in which the conductor plates 11 and 12, and the semiconductor elements 1 and 2 mounted on the conductor plates 11 and 12, respectively, are sealed with a sealing resin 3, the coolers 13 and 23 disposed facing at least one surface of the circuit body, and the insulating members disposed between the circuit body and the corresponding coolers 13 and 23. The insulating members of the power semiconductor device 100 include the insulating sheets 14 and 24 bonded to the coolers 13 and 23, respectively, the conductor layers 16 and 26 bonded to the surfaces of the insulating sheets 14 and 24, respectively, the surfaces facing the circuit body, and the electrically insulating heat dissipation greases 15 and 25 filled between the circuit body and the coolers 13 and 23, respectively, and formed covering respectively the insulating sheets 14 and 24, and the conductor layers 16 and 26. This configuration enables providing the power semiconductor device 100 in which miniaturization, high density, maintenance of insulation, and reliability are achieved in a compatible manner.

(2) The conductor layers 16 and 26 have the outer peripheral edges formed outward from the corresponding outer peripheral edges of the surfaces of the conductor plates 11 and 12 exposed from the sealing resin 3. This configuration enables preventing not only the void 4 from being formed on the outer periphery of any one of the conductor plates 11, 12, 21, and 22 but also the coolers 13 and 23 from being displaced in position from the circuit body.

(3) The conductor layers 16 and 26 are embedded in and bonded to the insulating sheets 14 and 24, respectively. This configuration enables suppressing occurrence of partial discharge at end parts of the conductor layers 16 and 26 when a high voltage is applied.

(4) The end parts of the conductor layers 16 and 26 are respectively covered with insulating resins 17 and 27 having lower elasticity than the sealing resin 3 of the circuit body. This configuration enables suppressing not only peeling of the conductor layers 16 and 26 from the insulating sheets 14 and 24, respectively, but also pumping out of electrically insulating heat dissipation greases 15 and 25.

(5) Not only the end parts of the conductor layers 16 and 26 but also end parts of the insulating sheets 14 and 24 are respectively covered with insulating resins 17 and 27 having lower elasticity than the sealing resin 3 of the circuit body. This configuration enables suppressing not only peeling of the conductor layers 16 and 26 from the insulating sheets 14 and 24, respectively, but also pumping out of electrically insulating heat dissipation greases 15 and 25.

The present invention is not limited to the above embodiments, and various modifications and other configurations can be combined without departing from the gist of the present invention. The present invention is also not limited to a configuration including every configuration described in each of the above embodiments, and includes a configuration in which a part of the configuration is deleted.

REFERENCE SIGNS LIST

100 power semiconductor device
1 power semiconductor element (IGBT)
2 power semiconductor element (diode)
3 sealing resin
4 void (space), trapped air
11 first conductor plate
12 second conductor plate
13 first cooler
14 insulating sheet
15 electrically insulating grease
16 conductor layer
17 insulating resin
21 third conductor plate
22 fourth conductor plate
23 second cooler
24 insulating sheet
25 electrically insulating grease
26 conductor layer
27 insulating resin

The invention claimed is:

1. A power semiconductor device comprising:
a circuit body in which a conductor plate and a semiconductor element mounted on the conductor plate are sealed with a sealing resin;
a cooler disposed opposite to at least one surface of the circuit body; and
an insulating member disposed between the circuit body and the cooler,
the insulating member including:
an insulating sheet bonded to the cooler;
a conductor layer bonded to a surface of the insulating sheet, the surface facing the circuit body, wherein the conductor layer has an outer peripheral edge formed outward from an outer peripheral edge of a surface of the conductor plate, the surface of the conductor plate being exposed from the sealing resin; and
electrically insulating heat dissipation grease filled between the circuit body and the cooler, and formed covering the insulating sheet and the conductor layer.

2. The power semiconductor device according to claim 1, wherein the conductor layer is embedded in and bonded to the insulating sheet.

3. The power semiconductor device according to claim 1, wherein the conductor layer has an end part covered with an insulating resin having lower elasticity than the sealing resin of the circuit body.

4. The power semiconductor device according to claim 1, wherein an end part of the conductor layer and an end part of the insulating sheet are covered with an insulating resin having lower elasticity than the sealing resin of the circuit body.

5. A power semiconductor device comprising:
a circuit body in which a conductor plate and a semiconductor element mounted on the conductor plate are sealed with a sealing resin;
a cooler disposed opposite to at least one surface of the circuit body; and
an insulating member disposed between the circuit body and the cooler,
the insulating member including:
an insulating sheet bonded to the cooler;
a conductor layer bonded to a surface of the insulating sheet, the surface facing the circuit body, wherein the conductor layer is embedded in and bonded to the insulating sheet; and
electrically insulating heat dissipation grease filled between the circuit body and the cooler, and formed covering the insulating sheet and the conductor layer.

6. A power semiconductor device comprising:
a circuit body in which a conductor plate and a semiconductor element mounted on the conductor plate are sealed with a sealing resin;
a cooler disposed opposite to at least one surface of the circuit body; and
an insulating member disposed between the circuit body and the cooler,
the insulating member including:
an insulating sheet bonded to the cooler;
a conductor layer bonded to a surface of the insulating sheet, the surface facing the circuit body, wherein the conductor layer has an end part covered with an insulating resin having lower elasticity than the sealing resin of the circuit body; and electrically insulating heat dissipation grease filled between the circuit body and the cooler, and formed covering the insulating sheet and the conductor layer.

* * * * *